United States Patent
Joseph et al.

(10) Patent No.: US 8,138,015 B2
(45) Date of Patent: Mar. 20, 2012

(54) INTERCONNECTION IN MULTI-CHIP WITH INTERPOSERS AND BRIDGES

(75) Inventors: Douglas James Joseph, Danbury, CT (US); John Ulrich Knickerbocker, Monroe, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/219,801

(22) Filed: Aug. 29, 2011

(65) Prior Publication Data

US 2011/0312129 A1   Dec. 22, 2011

Related U.S. Application Data

(62) Division of application No. 12/110,579, filed on Apr. 28, 2008, now Pat. No. 8,008,764.

(51) Int. Cl.
   *H01L 21/00* (2006.01)

(52) U.S. Cl. ......................................... 438/106; 361/760

(58) Field of Classification Search .......... 174/260–262; 361/760, 792–795; 438/106, 108
See application file for complete search history.

(56) References Cited

U.S. PATENT DOCUMENTS

| | | | |
|---|---|---|---|
| 5,854,507 A * | 12/1998 | Miremadi et al. | ............ 257/686 |
| 6,477,034 B1 | 11/2002 | Chakravorty et al. | |
| 7,554,203 B2 * | 6/2009 | Zhou et al. | ..................... 257/777 |
| 7,589,409 B2 * | 9/2009 | Gibson et al. | .................. 257/686 |
| 2009/0267238 A1 | 10/2009 | Joseph et al. | |

OTHER PUBLICATIONS

Office Action (Mail Date Jun. 18, 2010) for U.S. Appl. No. 12/110,579, filed Apr. 28, 2008; First Named Inventor Joseph et al.
Office Action Response (Filed Sep. 17, 2010) for U.S. Appl. No. 12/110,579, filed Date Apr. 28, 2008; First Named Inventor Joseph et al.
Final Office Action (Mail Date Oct. 15, 2010) for U.S. Appl. No. 12/110,579, filed Date Apr. 28, 2008; First Named Inventor Joseph et al.
Final Office Action Response (Filed Dec. 13, 2010) for U.S. Appl. No. 12/110,579, filed Date Apr. 28, 2008; First Named Inventor Joseph et al.
Advisory Action (Mail Date Dec. 17, 2010) for U.S. Appl. No. 12/110,579, filed Date Apr. 28, 2008; First Named Inventor Joseph et al.
Appeal Brief (Filed Mar. 18, 2011) for U.S. Appl. No. 12/110,579, filed Date Apr. 28, 2008; First Named Inventor Joseph et al.
Notice of Allowance (Mail Date Apr. 25, 2011) for U.S. Appl. No. 12/110,579, filed Date Apr. 28, 2008; First Named Inventor Joseph et al.

* cited by examiner

*Primary Examiner* — Jenny L Wagner
(74) *Attorney, Agent, or Firm* — Schmeiser Olsen & Watts; Daniel P. Morris

(57) ABSTRACT

A structure formation method. The method may include: attaching a substrate, a first interposer, a second interposer, and a first bridge together such that the first interposer is on and electrically connected to the substrate, the second interposer is on and electrically connected to the substrate, the first interposer comprises at least a first transistor, and the second interposer comprises at least a second transistor. The method may alternatively include: disposing both a first and second interposer on a substrate, wherein the first and second interposer are each electrically connected to the substrate; and electrically connecting a first bridge to the first and second interposers, wherein (i) the first bridge is in direct physical contact with the substrate or (ii) a bottom surface of the first bridge is within the substrate and below a top surface of the substrate.

20 Claims, 5 Drawing Sheets

INTERCONNECTION IN MULTI-CHIP WITH INTERPOSERS AND BRIDGES

This application is a divisional application claiming priority to Ser. No. 12/110,579, filed Apr. 28, 2008.

This invention was made with Government support under Contract No.: H98 230-07-C-0409 awarded by RES National Security Agency. The Government has certain rights in this invention.

FIELD OF THE INVENTION

The present invention relates generally to multi-chip integrated circuits and more particularly to silicon bridge interconnections for interconnecting interposers in multi-chip integrated circuits.

BACKGROUND OF THE INVENTION

In a typical multi-chip integrated circuit, interposers may be used to electrically connect the chips to the substrate. In other words, the chips can communicate with one another via the substrate. However, the bandwidth of the substrate is limited. Therefore, there is a need for a structure (and a method for forming the same) in which more communication channels between the chips are provided than in the prior art.

SUMMARY OF THE INVENTION

The present invention provides a structure, comprising a substrate; a first interposer on the substrate, wherein the first interposer is electrically connected to the substrate; a second interposer on the substrate, wherein the second interposer is electrically connected to the substrate; and a first bridge electrically connected to the first and second interposers.

The present invention provides a structure (and a method for forming the same) in which more communication channels in the chip are provided than in the prior art.

DETAILED DESCRIPTION OF THE INVENTION

Figure 1A:
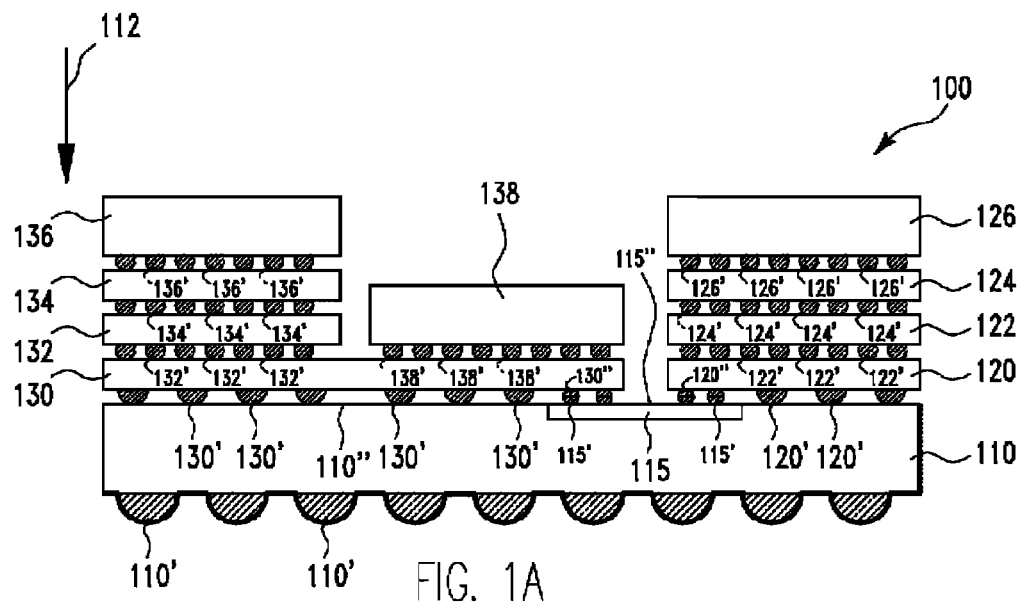
FIG. 1A shows a cross-section view of a first semiconductor structure, in accordance with embodiments of the present invention.

FIG. 1A shows a cross-section view of a semiconductor structure 100, in accordance with embodiments of the present invention. More specifically, with reference to FIG. 1A, the semiconductor structure 100 comprises a substrate 110, interposers 120, 122, 124, 130, 132, and 134 on the substrate 110, semiconductor chips (integrated circuits) 126, 136, and 138, and a bridge 115. In one embodiment, the semiconductor chip 136 is a microprocessor, the semiconductor chip 138 is a memory interfacing chip, and the semiconductor chip 126 is a memory chip.

Figure 1B:
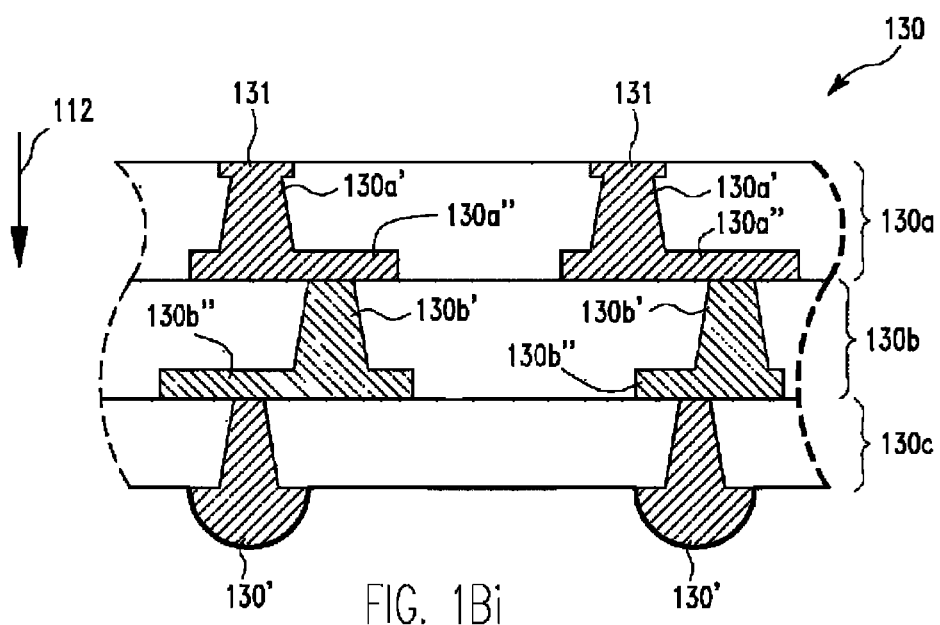
FIGS. 1Bi and 1Bii show cross-section views of two alternative embodiment of an interposer of the first semiconductor structure of FIG. 1A, in accordance with embodiments of the present invention.

In one embodiment, the interposer 130 comprises multiple interconnect layers (not shown in FIG. 1A but can be seen in FIGS. 1Bi and 1Bii). FIG. 1Bi shows a cross-section view of a portion of the interposer 130, in accordance with embodiments of the present invention. The thickness of the interposer 130 can be less than the thickness of the wafer from which the interposer 130 is formed. For instance, the thickness of the interposer 130 can be in a range of 10 µm to 100 µm, whereas the thickness of the wafer can be 700 µm. With reference to FIGS. 1A and 1Bi, the interposer 130 comprises interconnect layers 130a and 130b, solder balls 130' and 130", and backside pads 131. The interconnect layer 130a comprises electrically conductive wires 130a" and vias 130a'. Similarly, the interconnect layer 130b comprises electrically conductive wires 130b" and vias 130b'.

In one embodiment, the electrically conductive wires 130a" and 130b" run in directions that are perpendicular to a reference direction 112 (the reference direction 112 is perpendicular to the top surface 110" of the substrate 110). The vias 130a' and 130b' provide electrical paths between neighboring interconnect layers. For example, the vias 130b' provide electrical paths between the electrically conductive wires 130a" and 130b" of the interconnect layers 130a and 130b, respectively. The vias 130a' and 130b' can be traditional Front-End-Of-Line (FEOL) vias or Back-End-Of-Line (BEOL) vias. The electrically conductive wires 130a" and 130b" and the vias 130a' and 130b' comprise an electrically conductive material such as copper. The solder balls 130' and 130" are electrically connected to the backside pads 131. The solder balls 130' and 130" can comprise tin, lead, or a mixture of them, whereas the backside pads 131 can comprise aluminum.

In one embodiment, the solder balls 130' of the interposer 130 are physically attached to substrate pads (not shown) of the substrate 110. The substrate pads of the substrate 110 are electrically connected to substrate balls 110' of the substrate 110. The backside pads 131 of the interposer 130 are physically attached to solder balls 132' of the interposer 132 and solder balls 138' of the semiconductor chip 138.

FIG. 1Bii shows an alternative embodiment of the interposer 130 of FIG. 1Bi. More specifically, the interposer 130 of FIG. 1Bii is similar to the interposer 130 of FIG. 1Bi except that the interposer 130 of FIG. 1Bii comprises a device layer 130d. With reference to FIG. 1Bii, the device layer 130d can comprise a device 135. The device 135 can comprise transistors, capacitors, resistors, or a combination of them. For example, the device can be an integrated circuit. The device 135 can be electrically connected to the backside pads 131 through electrical paths (not shown). The device 135 can also be electrically connected to the solder balls 130' of the interposer 130 through the interconnect layers 130a and 130b. The interposer 130 of FIG. 1Bii can be referred to as a semiconductor chip 130. The structures 130 of FIGS. 1Bi and 1Bii can be formed by conventional methods. In one embodiment, the semiconductor chip 130 of FIG. 1Bii can be one of the following: a memory interface chip, a switch chip, an optoelectronic transceiver chip, a photo detector chip, an application specific integrated circuit (ASIC) chip, or a field programmable gate array (FPGA) chip.

In one embodiment, each of the interposers 120, 122, 124, 132, and 134 and the bridge 115 is similar to either the interposer 130 of FIG. 1Bi or the semiconductor chip 130 of FIG. 1Bii. As a result, in one embodiment, some of the interposers 120, 122, 124, 130, 132, and 134 and the bridge 115 are semiconductor chips (similar to the semiconductor chip 130 of FIG. 1Bii), and the others are interposers without any device (similar to the interposer 130 of FIG. 1Bi). In one embodiment, the interposer 132 is a voltage regulation chip 132, and the interposer 134 is a cache memory chip 134.

In one embodiment, the substrate 110 can be a ceramic substrate or an organic substrate. The substrate 110 can comprise multiple interconnect layers (not shown but similar to the interconnect layers 130a and 130b of FIG. 1Bi). The interposers 120 and 130 are electrically connected to the substrate 110 through solder balls 120' and 130' of the interposers 120 and 130, respectively. The semiconductor chip 138 is electrically connected to the interposer 130 through solder balls 138' of the semiconductor chip 138. The semiconductor chip 126 is electrically connected to the interposer 120 though the interposers 120, 122, and 124. Similarly, the semiconductor chip 136 is electrically connected to the interposers 130 though the voltage regulation chip 132 and the cache memory chip 134.

In one embodiment, the interposer 124 is electrically connected to the interposer 122 through solder balls 124' of the interposer 124, and the interposer layer 122 is electrically connected to the interposer 120 through solder balls 122' of the interposer 122. Similarly, the processor chip 136 is attached via solder interconnections to the cache memory chip or memory interface chip 134 which is electrically connected to one or more other cache memory chips, memory interface chips and/or a voltage regulation chip such as silicon package interposer layers 132 and 130 (and additional layers as needed but not shown) using solder balls.

In one embodiment, the interposers 120 and 130 are electrically connected to each other through the bridge 115. More specifically, the interposer 120 is electrically connected to the bridge 115 through solder balls 115'+120", and the interposer 130 is electrically connected to the bridge 115 through solder balls 115'+130". The solder balls 115'+120" result from solder balls 115' of the bridge 115 and the solder balls 120" of the interposer 120 being bonded together. Similarly, the solder balls 115'+130" result from the solder balls 115' of the bridge 115 and the solder balls 130" of the interposer 130 being bonded together. Alternatives for bonding include use of solder from one component to a pad on an adjacent layer of strata, solder to solder interconnection or use of alternate electrical and thermal interconnection material.

In one embodiment, the fabrication process of the structure 100 is as follows. The substrate 110 is formed having the substrate balls 110' as shown. The substrate 110 with its substrate balls 110' can be formed by a conventional method. Similarly, the semiconductor chips 136, 138, and 126 are separately formed having their respective solder balls 136', 138', and 126' thereon as shown. The interposers 130, 120, 122, and 124 can be separately formed having their respective solder balls 130', 130", 120', 120", 122', and 124' thereon as shown. The voltage regulation chip 132 and the cache memory chip 134 can be separately formed having their respective solder balls 132' and 134' thereon as shown. The bridge 115 with its solder balls 115' can also be separately formed.

Next, in one embodiment, the semiconductor chip 136 is physically attached to the cache memory chip 134 by physically attaching the solder balls 136' of the semiconductor chip 136 to backside pads (not shown) of the cache memory chip 134 resulting in a chip stack 136+134. The semiconductor chip 136 can be attached to the cache memory chip 134 by a conventional flip-chip technology. More specifically, the semiconductor chip 136 can be attached to the cache memory chip 134 at a pressure of from 0 to 200 PSI with temperature of about 300 to 450 C and with a controlled ambient such as N2, Forming Gas mix of Nitrogen and Hydrogen or alternate ambient, such that the solder balls 136' melt and bond to the backside pads of the cache memory chip 134 resulting in the chip stack 136+134. Then, the chip stack 136+134 is cooled down. Then, the chip stack 136+134 can be tested by a first test process. Assume that the chip stack 136+134 passes the first test process.

Next, in one embodiment, the chip stack 136+134 is physically attached to the voltage regulation chip 132 by attaching the solder balls 134' of the cache memory chip 134 to the backside pads (not shown) of the voltage regulation chip 132 resulting in a chip stack 136+134+132. More specifically, the chip stack 136+134 can be attached to the voltage regulation chip 132 by a conventional flip-chip technology. Then, the chip stack 136+134+132 can be tested by a second test process. Assume that the chip stack 136+134+132 passes the second test process.

Next, in one embodiment, the chip stack 136+134+132 is physically attached to the interposer layer 130 by physically attaching the solder balls 132' of the voltage regulation chip 132 to the backside pads (not shown) of the interposer 130 resulting in a chip stack 136+134+132+130. More specifically, the chip stack 136+134+132 can be attached to the interposer 130 by a conventional flip-chip technology. Then, the chip stack 136+136+132+130 can be tested by a third test process. Assume that the chip stack 136+134+132+130 passes the third test process. In one embodiment, the chip stack assembly or chip stack and interposer assembly (such as 136, 134, 132 and 130 in one example) may be either fully assembled and tested for a known good die stack or partially assembled and tested, further assembled with other die or die stack subcomponents and then tested depending upon the complexity of the die, their yield, any redundancy built into the vertical interconnection layers and circuits, the assembly approach which may consist of die to die, die to package, die to wafer or wafer to wafer assembly processes chosen for specific applications.

Next, in one embodiment, the semiconductor chip 138 is physically attached to the interposer 130 by physically attaching the solder balls 138' of the semiconductor chip 138 to the backside pads (not shown) of the interposer 130 resulting in a first chip block 136+134+132+130+138. More specifically, the semiconductor chip 138 can be attached to the interposer 130 by a conventional flip-chip technology. Then, the first chip block 136+134+132+130+138 can be tested by a fourth test process. Assume that the first chip block 136+134+132+130+138 passes the fourth test process.

In one embodiment, separately from the formation of the first chip block 136+134+132+130+138, the semiconductor chip 126 and the interposers 124, 122, and 120 are in turn attached together, as shown in FIG. 1A, resulting in a second chip block 126+124+122+120. More specifically, the semiconductor chip 126 and the interposers 124, 122, and 120 are attached together in a manner similar to the manner in which the semiconductor chip 136, the cache memory chip 134, the voltage regulation chip 132, and the interposer 130 are attached together. Then, the second chip block 126+124+

122+120 can be tested by a fifth test process. Assume that the second chip block 126+124+122+120 passes the fifth test process.

In one embodiment, the bridge 115 is attached to the substrate 110 such that the top surface 115" of the bridge 115 and the top surface 110" of the substrate are coplanar. If the substrate 110 is a ceramic substrate, then the ceramic substrate 110 can be ground so as to create a space to accommodate the bridge 115. Then, the bridge 115 can be attached to the ceramic substrate 110 by an adhesive material. If the substrate 110 is an organic substrate, then the bridge 115 is attached to the organic substrate 110 by pressing the bridge 115 into the organic substrate 110 (with an adhesive material between them).

Next, in one embodiment, the first chip block 136+134+132+130+138 is attached to the substrate 110 and the bridge 115 by simultaneously attaching the solder balls 130' and 130" of the interposer 130 to substrate pads (not shown) of the substrate 110 and the solder balls 115' of the bridge 115. It should be noted that, during this attachment process, two solder balls 130" bond to two solder balls 115' resulting in the two bonded solder balls 115'+130" as shown.

Similarly, the second chip block 126+124+122+120 is attached to the substrate 110 and the bridge 115 by simultaneously attaching the solder balls 120' and 120" of the interposer 120 to substrate pads (not shown) of the substrate 110 and the solder balls 115' of the bridge 115. It should be noted that, during this attachment process, two solder balls 120" merge two solder balls 115' resulting in the two bonded solder balls 115'+120" as shown. In one embodiment, the attachment of the first chip block 136+134+132+130+138 to the substrate 110 and the bridge 115 and the attachment of the second chip block 126+124+122+120 to the substrate 110 and the bridge 115 can be performed simultaneously. Then, the structure 100 can be tested by a sixth test process.

In summary, the structure 100 is formed by attaching different components (the semiconductor chips 136, 138, and 126, the cache memory chip 134, the voltage regulation chip 132, the interposers 130, 124, 122, and 120, the bridge 115 and the substrate 110) together. Each component can be independently tested after its formation. After a component or a block of components is attached to another component or another block of components, testing can be done for the resulting block of components.

Figure 1C:
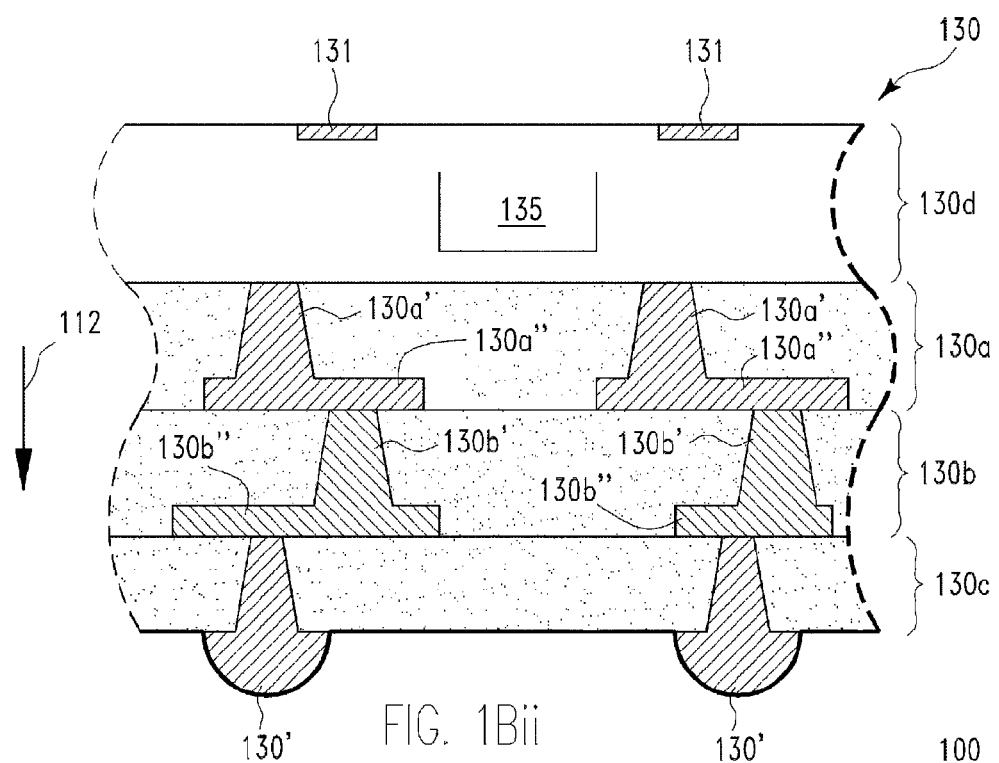
FIG. 1C shows a top-down view of the first semiconductor structure of FIG. 1A, in accordance with embodiments of the present invention.
Figure 1C:
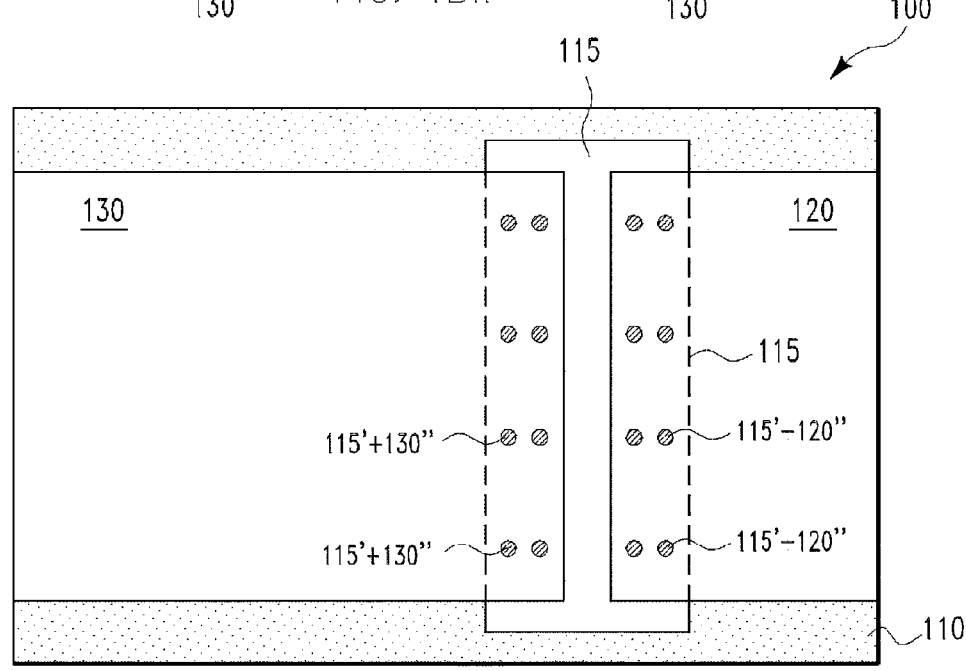

FIG. 1C shows a top-down view of the structure 100 of FIG. 1A. With reference to FIGS. 1A and 1C, for simplicity, only the substrate 110, the interposers 120 and 130, and the bridge 115 of FIG. 1A are shown in FIG. 1C, whereas the chips 136, 138, and 126 and the cache memory chip 134, the voltage regulation chip 132, and interposers 124 and 122 of FIG. 1A are not shown in FIG. 1C.

In the embodiments described above, it is assumed that the first chip block 136+134+132+130+138 passes the fourth test process after its formation. Alternatively, if the first chip block 136+134+132+130+138 fails the fourth test process, then it is replaced by another first chip block 136+134+132+130+138 and then the fourth test process is performed again.

In the embodiments described above, the semiconductor chip 136, the cache memory chip 134, the voltage regulation chip 132, and the interposer 130 are attached together in the order described above. Alternatively, the semiconductor chip 136, the cache memory chip 134, the voltage regulation chip 132, and the interposer 130 are attached together in a different order. More specifically, the voltage regulation chip 132 is attached to the interposer 130 resulting in a chip stack 130+132. Next, the cache memory chip 134 is attached to the chip stack 130+132 resulting in a chip stack 130+132+134. Then, the semiconductor chip 136 is attached to the chip stack 130+132+134 resulting in the chip stack 130+132+134+136. Similarly, the semiconductor chip 126, the interposers 124, 122, and 120 can be attached together in an order different than that described above.

Figure 2:
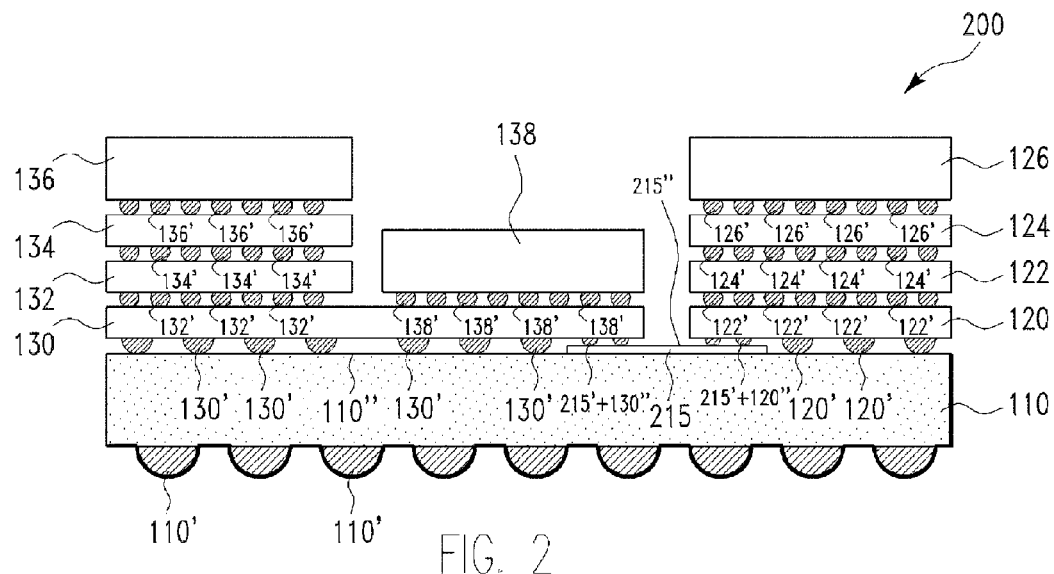
FIG. 2 shows a cross-section view of a second semiconductor structure, in accordance with embodiments of the present invention.

FIG. 2 shows a cross-section view of a semiconductor structure 200, in accordance with embodiments of the present invention. More specifically, with reference to FIG. 2, the structure 200 is similar to the structure 100 of FIG. 1A except that the bridge 215 is placed on the top surface 110" of the substrate 110. More specifically, the bridge 215 can be physically attached to the top surface 110" of the substrate 110 by an adhesive material.

In one embodiment, the fabrication process of the structure 200 is similar to the fabrication process of the structure 100 of FIG. 1A except that the bridge 215 is physically attached to the substrate 110 only by an adhesive material whether the substrate 110 is a ceramic substrate or an organic substrate. It should be noted that merged solder balls 215'+130" and 215'+120" of FIG. 2 are smaller than the bonded solder balls 115'+130" and 115'+120" of FIG. 1A. In one embodiment, the bridge 215 of FIG. 2 is similar to the bridge 115 of FIG. 1A except that the bridge 215 is thinner than the bridge 115 in the reference direction 112 so as to create more space for the merged solder balls 215'+130" and 215'+120".

Figure 3:
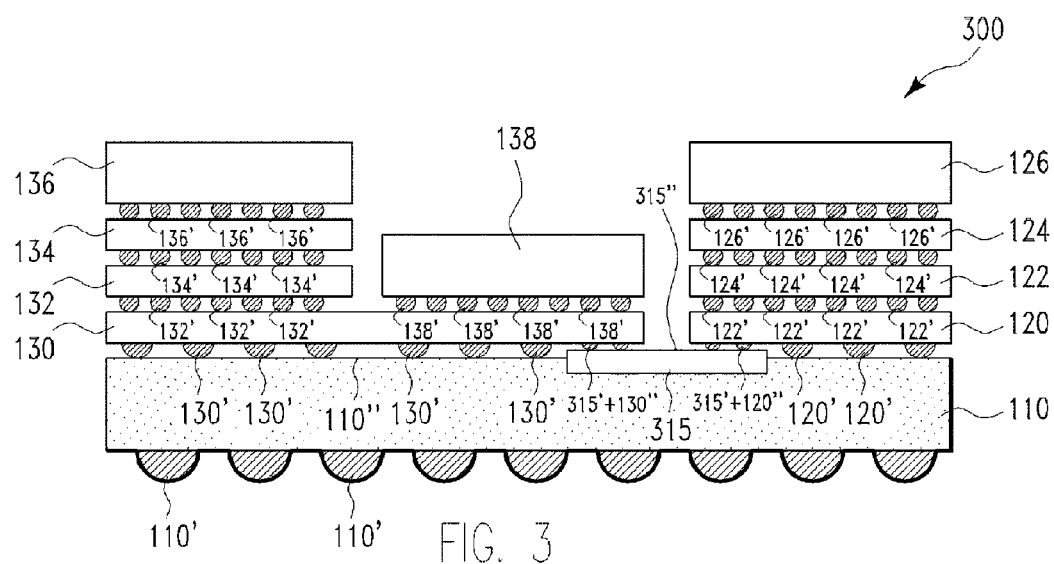
FIG. 3 shows a cross-section view of a third semiconductor structure, in accordance with embodiments of the present invention.

FIG. 3 shows a cross-section view of a semiconductor structure 300, in accordance with embodiments of the present invention. More specifically, with reference to FIG. 3, the structure 300 is similar to the structure 100 of FIG. 1A except that the top surface 315" of the bridge 315 and the top surface 110" of the substrate 110 are not coplanar. The bridge 315 can be similar to the bridge 115 but thicker than the bridge 115 in the reference direction 112. In one embodiment, the fabrication process of the structure 300 is similar to the fabrication process of the structure 100 of FIG. 1A.

Figure 4:
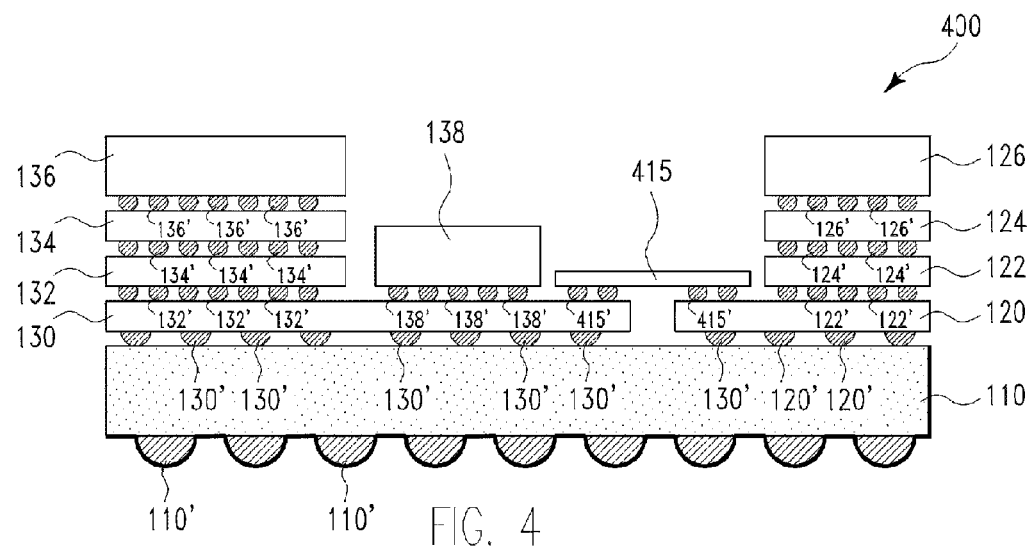
FIG. 4 shows a cross-section view of a fourth semiconductor structure, in accordance with embodiments of the present invention.

FIG. 4 shows a cross-section view of a semiconductor structure 400, in accordance with embodiments of the present invention. More specifically, with reference to FIG. 4, the structure 400 is similar to the structure 100 of FIG. 1A except that the bridge 415 is physically attached to the interposers 120 and 130 by physically attaching the solder balls 415' of the bridge 415 to the backside pads (not shown) of the interposer 120 and 130. In one embodiment, the bridge 415 may be the full thickness from the wafer it was fabricated from (not shown) or the same thickness as other die or die stacks on top of the interposer(s).

In one embodiment, the fabrication process of the structure 400 is similar to the fabrication process of the FIG. 1A except that the bridge 415 is attached to the interposers 120 and 130 after the interposers 120 and 130 are attached to the substrate 110.

Figure 5:
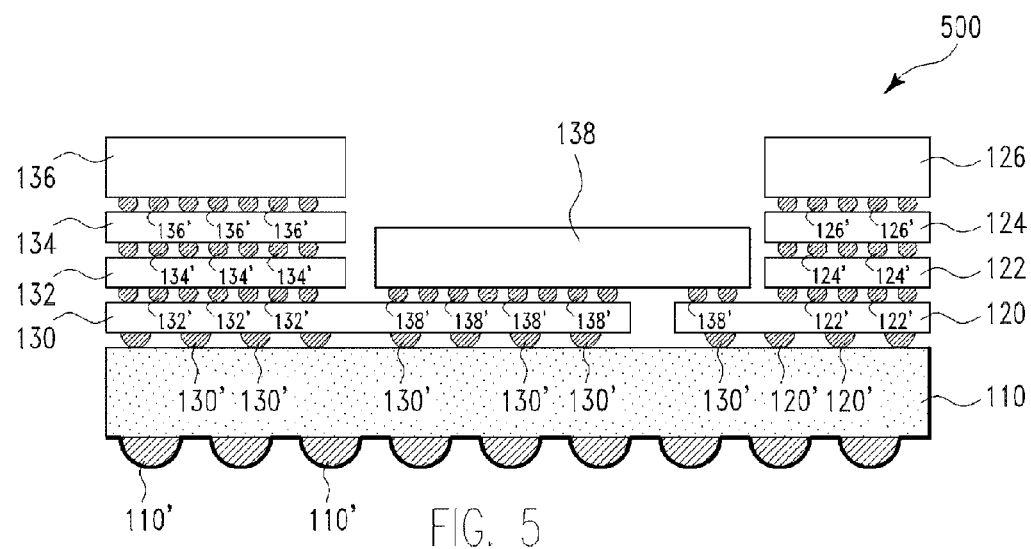
FIG. 5 shows a cross-section view of a fifth semiconductor structure, in accordance with embodiments of the present invention.

FIG. 5 shows a cross-section view of a semiconductor structure 500, in accordance with embodiments of the present invention. More specifically, with reference to FIG. 5, the structure 500 is similar to the structure 100 of FIG. 1A except that (i) the bridge 115 is omitted and (ii) the semiconductor chip 138 plays the role of a bridge electrically connecting the interposers 120 and 130 together. More specifically, the solder balls 138' of the semiconductor chip 138 are physically attached to backside pads (not shown) of the interposers 120 and 130.

In one embodiment, the fabrication process of the structure 500 is similar to the structure 100 of FIG. 1A except that the semiconductor chip 138 is attached to both the interposers 120 and 130 after the chip block 136+134+132+130 and the chip block 126+124+122+120 are attached to the substrate 110. After the chip block 136+134+132+130 and the chip block 126+124+122+120 are attached to the substrate 110, the semiconductor chip 138 is physically attached to the interposers 120 and 130 simultaneously by a conventional flip-chip technology.

In the embodiments described above, with reference to FIG. 1A, the solder balls 120" and 130" of the interposers 120 and 130, respectively, are bonded one-to-one to the solder balls 115' of the bridge 115. Alternatively, the solder balls 115' of the bridge 115 are replaced by bridge pads therein and the solder balls 120" and 130" of the interposers 120 and 130, respectively, are bonded one-to-one to the bridge pads of the bridge 115. The bridge pads can comprise an electrically conductive material such as aluminum.

Figure 6:
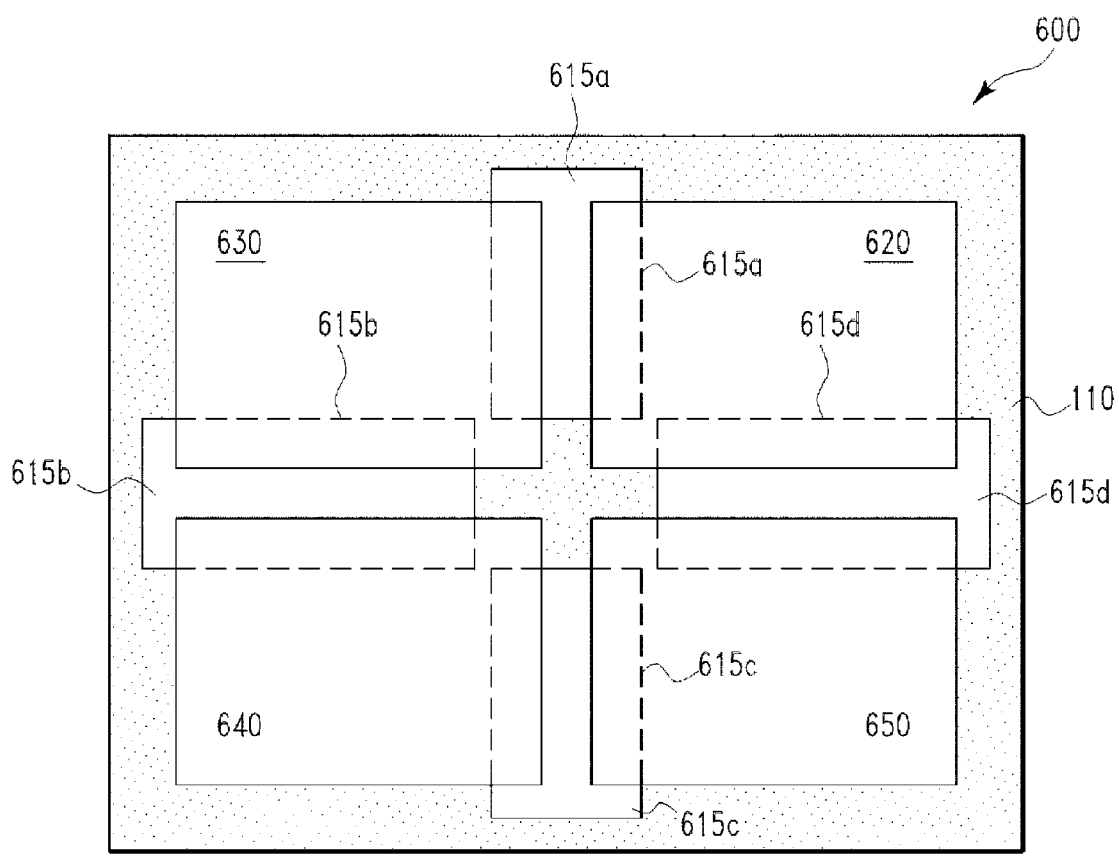
FIG. 6 shows a top-down view of a sixth semiconductor structure, in accordance with embodiments of the present invention.

In the embodiments described above, there are two interposers 120 and 130 attached to the substrate 110. In general, N interposers can be attached to the substrate 110, wherein N is a positive integer. The N interposers can be electrically connected together through bridges and solder balls (similar to the bridge 115 and the solder balls 115'+120" and 115'+130" of FIG. 1A). For example, FIG. 6 shows a top-down view of a semiconductor structure 600, in accordance with embodiments of the present invention. More specifically, with reference to FIG. 6, the structure 600 comprises four interposers 620, 630, 640, and 650 and four bridges 615a, 615b, 615c, and 615d. The interposer 620 and 630 are electrically connected to each other through the bridge 615a. The interposer 620 and 650 are electrically connected to each other through the bridge 615d. The interposer 630 and 640 are electrically connected to each other through the bridge 615b. The interposer 640 and 650 are electrically connected to each other through the bridge 615c.

In the embodiments described above, with reference to FIG. 1A, the semiconductor chip 136 is a microprocessor, the semiconductor chip 138 is a memory interfacing chip, and the semiconductor chip 126 is a memory chip. Alternatively, the dies/chips or die stacks in FIG. 1A may serve other functions than microprocessor and memory or cache such as memory interface die, application specific integrated circuit die, optoelectronic die, photo detectors, communications switch chips, and/or other functional die or integrated heterogeneous die.

In the embodiments described above, with reference to FIG. 1A, the interposer 130 is connected to the substrate 110 by the connection of the solder balls 130' of the interposer 130 and the substrate pads of the substrate 110 (i.e., solder ball-to-pad interconnections), whereas the interposer 130 is connected to the bridge 115 by the connection of the solder balls 130" of the interposer 130 and the solder balls 115' of the bridge 115 (solder ball-to-solder ball interconnections). Similarly, the electrical connections between two interposers (e.g., the interposers 132 and 130) or between a chip and an interposer (e.g., the chip 136 and the interposer 134) are solder ball-to-pad interconnections. In general, the connections between the interposer 130 and the substrate 110, between the interposer 130 and the bridge 115, between two interposers, and between a chip and an interposer are one of the following: solder ball-to-solder ball interconnections, solder ball-to-pad interconnections, stud-to-pad interconnections. Each of the solder ball, the pad, and the stud can be referred to as a connector.

In the embodiments described above, with reference to FIGS. 1Bi and 1Bii, the solder balls 130' of the interposer 130 are electrically connected to the backside pads 131 of the interposer 130 through interconnect layers 130b and 130c and the device layer 130d. Alternatively, the solder balls 130' are electrically connected to the backside pads 131 through a vertical through-silicon-via (TSV).

In the embodiments described above, the solder balls 130' and 130" can comprise tin, lead, or a mixture of them, whereas the backside pads 131 can comprise aluminum. In general, the solder balls can comprise tin, silver, gold, or a mixture of them, the pads can comprise copper, gold, nickel, or a mixture of them, whereas the stud can comprise copper.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure formation method, said method comprising:
    attaching a substrate, a first interposer, a second interposer, and a first bridge together such that the first interposer is on and electrically connected to the substrate, the second interposer is on and electrically connected to the substrate, the first interposer comprises at least a first transistor, and the second interposer comprises at least a second transistor.

2. The method of claim 1,
    wherein the substrate comprises substrate connectors,
    wherein the first interposer comprises first interposer connectors,
    wherein the second interposer comprises second interposer connectors,
    wherein the first and second interposer connectors are electrically connected to the substrate connectors, and
    wherein each connector of the substrate connectors, the first interposer connectors, and the second interposer connectors comprises one selected from the group consisting of a solder ball, a pad, and a stud.

3. The method of claim 2,
    wherein the first interposer further comprises first bonding connectors,
    wherein the second interposer further comprises second bonding connectors,
    wherein the first bridge comprises bridge connectors,
    wherein the first and second bonding connectors are in direct physical contact one-to-one with the bridge connectors, and
    wherein each connector of the first bonding connectors, the second bonding connectors, and the bridge connectors is independently selected from the group consisting of a solder ball, a pad, and a stud.

4. The method of claim 3, said method further comprising:
    disposing a third interposer on the first interposer, wherein the third interposer is electrically connected to the first interposer, and wherein the third interposer comprises at least a third transistor.

5. The method of claim 4, said method further comprising:
    disposing a fourth interposer on the first interposer, wherein the fourth interposer is electrically connected to the first interposer, and wherein fourth interposer comprises at least a fourth transistor.

6. The method of claim 1, wherein said attaching the substrate, the first interposer, the second interposer, and the first bridge together comprises:
    attaching the first bridge to the substrate;
    after said attaching the first bridge to the substrate, attaching the first interposer to both the substrate and the first bridge; and
    after said attaching the first bridge to the substrate, attaching the second interposer to both the substrate and the first bridge.

7. The method of claim 1, wherein said attaching the substrate, the first interposer, the second interposer, and the first bridge together comprises:

attaching the first and second interposers to the substrate; and after said attaching the first and second interposers to the substrate, attaching the first bridge to the first and second interposers.

8. The method of claim 1, wherein a top surface of the first bridge is external to the substrate and above a top surface of the substrate.

9. The method of claim 1, wherein the first bridge comprises bridge connectors, wherein the first interposer comprises first interposer connectors, wherein the second interposer comprises second interposer connectors, wherein the bridge connectors are in direct physical contact one-to-one with the first and second interposer connectors, and wherein each connector of the first interposer connectors, the second interposer connectors, and the bridge connectors is independently selected from the group consisting of a solder ball, a pad, and a stud.

10. The method of claim 9, wherein the first bridge comprises an integrated circuit.

11. A structure formation method, said method comprising:

disposing a first interposer on a substrate, wherein the first interposer is electrically connected to the substrate;

disposing a second interposer on the substrate, wherein the second interposer is electrically connected to the substrate; and electrically connecting a first bridge to the first and second interposers, wherein the first bridge is in direct physical contact with the substrate.

12. The method of claim 11, wherein the substrate comprises substrate connectors, wherein the first interposer comprises first interposer connectors, wherein the second interposer comprises second interposer connectors, wherein the first and second interposer connectors are electrically connected to the substrate connectors, and wherein each connector of the first interposer connectors, the second interposer connectors, and the bridge connectors is independently selected from the group consisting of a solder ball, a pad, and a stud.

13. The method of claim 12, said method further comprising:

disposing a third interposer on the first interposer, wherein the third interposer is electrically connected to the first interposer.

14. The method of claim 13, said method further comprising:

disposing a fourth interposer on the first interposer, wherein the fourth interposer is electrically connected to the first interposer.

15. The method of claim 11, wherein a top surface of the first bridge is external to the substrate and above a top surface of the substrate.

16. The method of claim 11, wherein a bottom surface of the first bridge is within the substrate and below a top surface of the substrate.

17. The method of claim 11, wherein a top surface of the first bridge is external to the substrate and above a top surface of the substrate, wherein a bottom surface of the first bridge is within the substrate and below the top surface of the substrate.

18. The method of claim 1, wherein a bottom surface of the first bridge is within the substrate and below a top surface of the substrate.

19. The method of claim 1, wherein a top surface of the first bridge is external to the substrate and above a top surface of the substrate, wherein a bottom surface of the first bridge is within the substrate and below the top surface of the substrate.

20. The method of claim 19, wherein the first bridge is in direct physical contact with the substrate.

* * * * *